(12) United States Patent
Choi

(10) Patent No.: US 6,228,714 B1
(45) Date of Patent: May 8, 2001

(54) METHOD FOR MANUFACTURING NONVOLATILE MEMORY DEVICE

(75) Inventor: Jung-dal Choi, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/387,078

(22) Filed: Aug. 31, 1999

(30) Foreign Application Priority Data

Aug. 31, 1998 (KR) .................................. 98-35721

(51) Int. Cl.⁷ ............................................. H01L 21/8247
(52) U.S. Cl. ........................... 438/258; 438/382; 438/384
(58) Field of Search .................................. 438/257–267, 438/382, 384

(56) References Cited

U.S. PATENT DOCUMENTS

| | | | |
|---|---|---|---|
| 5,472,892 | * 12/1995 | Gwen et al. . | |
| 5,879,983 | * 3/1999 | Segawa et al. | 438/253 |
| 5,908,311 | * 6/1999 | Chi et al. | 438/258 |
| 5,970,338 | * 10/1999 | Tempel | 438/241 |
| 6,004,841 | * 12/1999 | Chang et al. | 438/238 |

* cited by examiner

Primary Examiner—Richard Booth
(74) Attorney, Agent, or Firm—Marger Johnson & McCollom, P.C.

(57) ABSTRACT

A method for manufacturing a nonvolatile memory device is provided. A first conductive layer is formed on a semiconductor substrate. The first conductive layer is patterned such that an isolated resistor pattern is formed on a predetermined region of a peripheral circuit region. A dielectric layer and a second conductive layer are sequentially formed on the semiconductor substrate. The second conductive layer is patterned to form a second conductive layer pattern exposing the entire dielectric layer of a resistor region in the peripheral circuit region and a predetermined region of the dielectric layer of a MOS transistor region. The second conductive layer pattern, the dielectric layer, and the first conductive layer pattern are sequentially patterned to simultaneously form a gate pattern of a cell transistor and a gate pattern of the MOS transistor. The gate pattern of the MOS transistor includes a predetermined region of the dielectric layer exposed during forming of the second conductive layer pattern. An interdielectric layer is formed on the resultant structure where the gate pattern is formed. The interdielectric layer is patterned to form a contact hole exposing the gate electrode of the MOS transistor and a predetermined region of the resistor pattern.

23 Claims, 7 Drawing Sheets

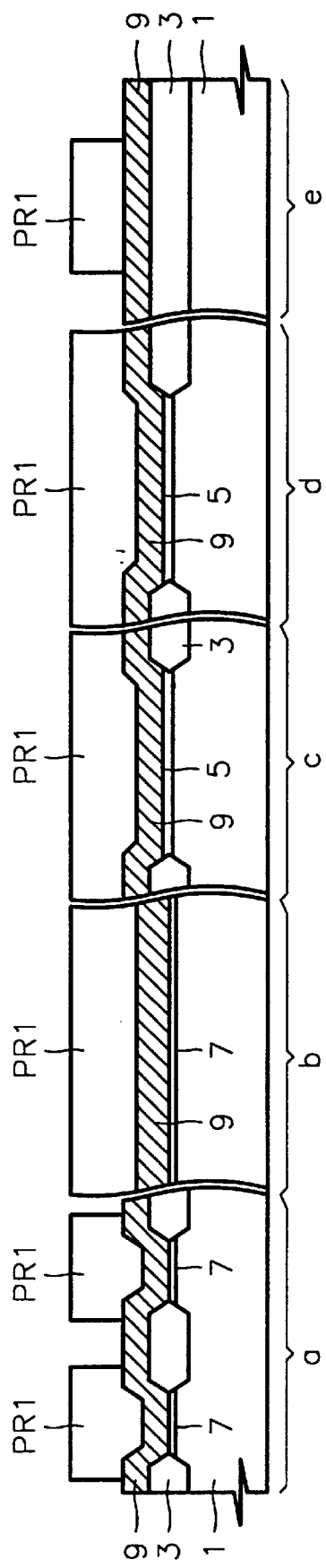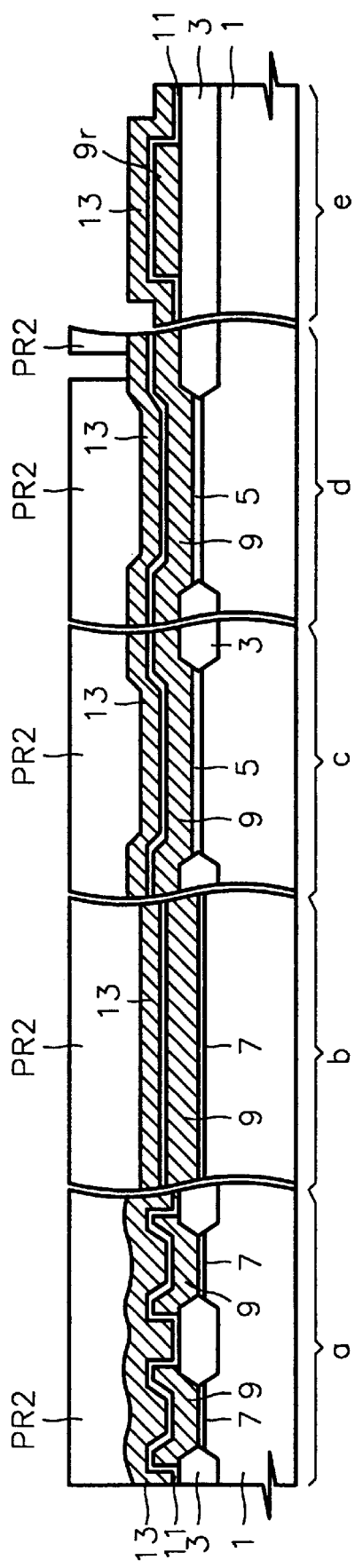

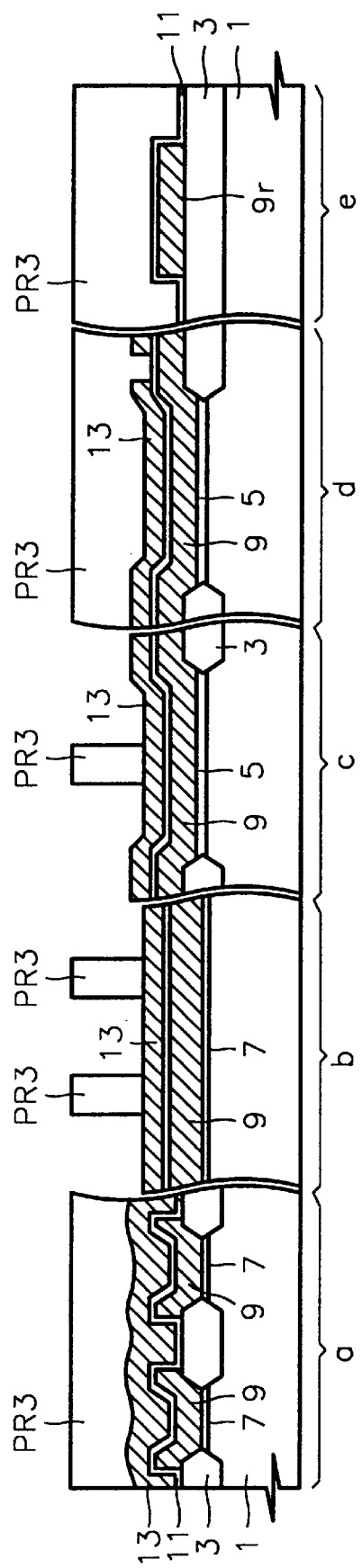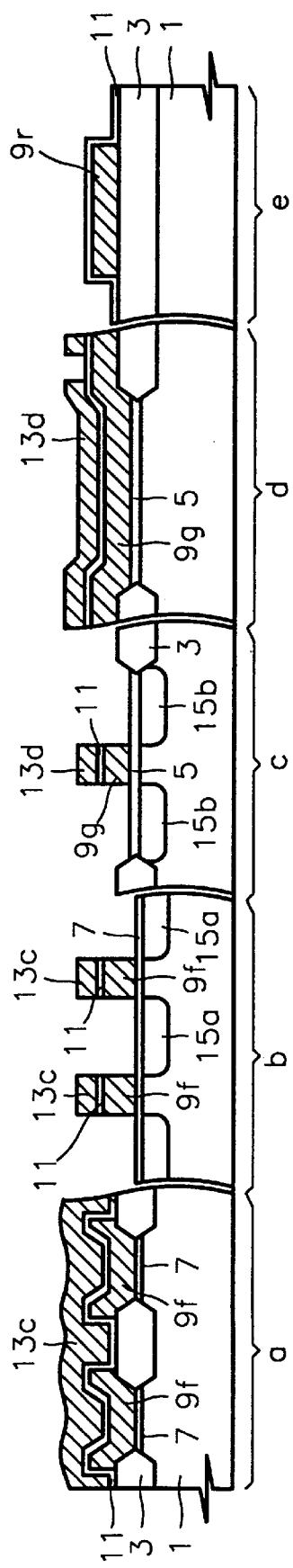

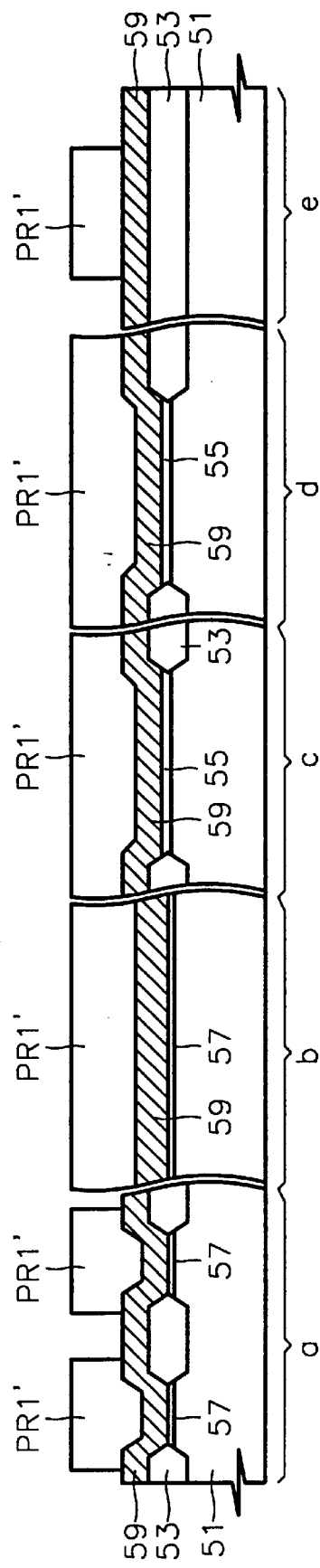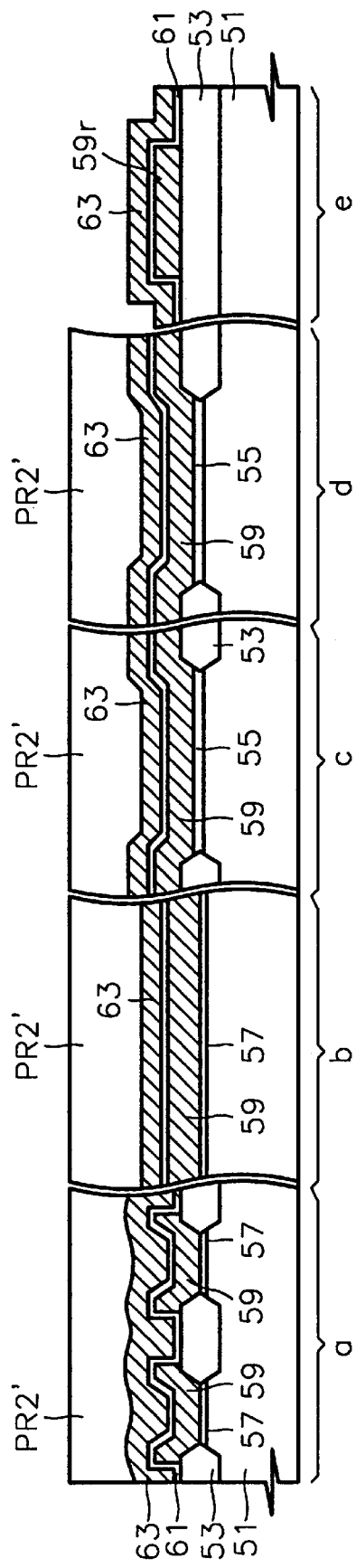

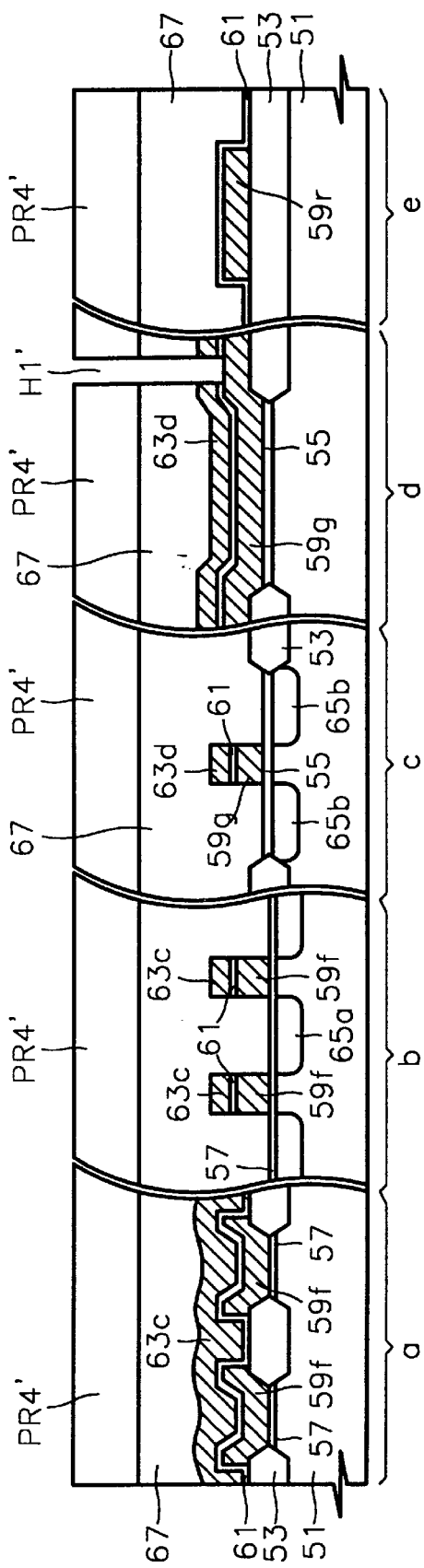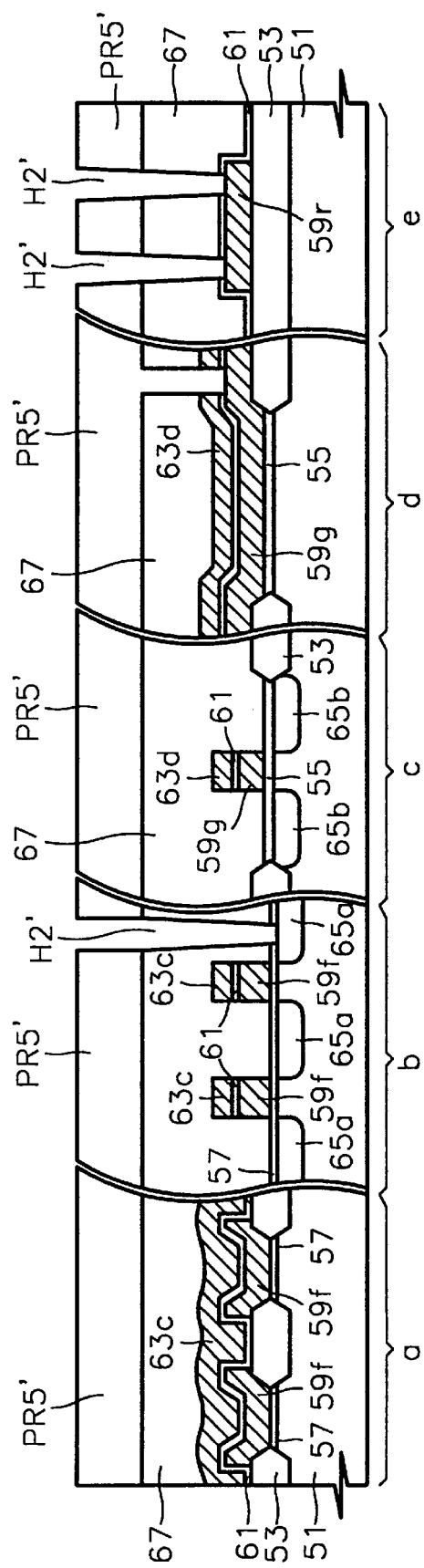

METHOD FOR MANUFACTURING NONVOLATILE MEMORY DEVICE

BACKGROUND OF THE INVENTION

1. Field of the Invention

The present invention relates to a method for manufacturing a semiconductor device and, more particularly, to a method for manufacturing a nonvolatile memory device.

2. Description of the Related Art

The nonvolatile memory device is widely used in a computer or a memory card because information stored in a memory cell thereof is not erased even when power supply is turned off. A cell transistor of the nonvolatile memory device has a stacked gate structure in which a floating gate, an insulating layer, and a control gate electrode are sequentially formed on a tunnel oxide layer. In the stacked gate structures the floating gate stores electric charge and the control gate electrode serves as a wordline. However, a MOS transistor used for a peripheral circuit of the nonvolatile memory device includes a single gate electrode formed on a predetermined region of the gate insulating layer. The single gate electrode of the MOS transistor makes it difficult to form the gate pattern of both cell transistors through the same process.

A method for forming the single gate electrode of the MOS transistor formed on the peripheral circuit region and the gate pattern of the cell transistor formed on the cell array region using the same process is disclosed in Japanese Pat. No. 59,074,677A ("'677A patent"). According to the '677A patent, the gate pattern of the MOS transistor formed on the peripheral circuit region has the same stacked gate structure as that of the cell transistor. The '677A patent describes the MOS transistor as comprising first and second conductive layers and a dielectric layer interposed therebetween. The first and second conductive layers of the MOS transistor are electrically connected through a first contact hole passing through a predetermined region of the dielectric layer. Also, the second conductive layer is electrically connected to a metal interconnection through a second contact hole passing through a predetermined region of the interdielectric layer formed on the second conductive layer. The second conductive layer forms the gate pattern of the MOS transistor. The first conductive layer then is connected to a metal interconnection through the first and the second contact holes. As a result, the second conductive layer is interposed between the gate electrode of the MOS transistor forming the peripheral circuit and the metal interconnection. Thus, contact resistance between the first conductive layer and the second conductive layer deteriorates the propagation speed of an electric signal applied to the gate electrode of the MOS transistor. Also, according to the '677A patent, the second conductive layer is stacked on the first conductive layer such that forming a resistor using only the first conductive layer is difficult. The first conductive layer is generally formed of a polysilicon layer. When the resistor is formed of the first conductive layer, it is easy to control the resistance value of the resistor. Thus, it is difficult to form a resistor having a desired resistance value using the methodology disclosed in the '677A patent.

SUMMARY OF THE INVENTION

It is an object of the present invention to overcome the disadvantages of prior art nonvolatile semiconductor memory devices.

It is another object of the present invention to provide a method for manufacturing a nonvolatile memory device in which a gate pattern of a cell transistor and a gate pattern of a MOS transistor can be formed using the same process.

It is yet another object of the present invention to provide a method for manufacturing a nonvolatile memory device in which a gate electrode of the MOS transistor and a resistor can be connected directly to a metal interconnection.

A method for manufacturing a nonvolatile memory device having a cell array and a peripheral circuit region is provided. The cell array region includes a cell array having a plurality of cell transistors and the peripheral circuit region includes a resistor and a MOS transistor for driving the cell array. The method comprises forming a first conductive layer on a semiconductor substrate and forming a first conductive layer pattern by patterning the first conductive layer, forming the first conductive layer pattern includes forming an isolated resistor pattern in a resistor region of the peripheral circuit region. The method further includes sequentially forming a dielectric layer and a second conductive layer on the substrate and forming a second conductive layer pattern exposing a predetermined portion of the MOS transistor region and a whole area of the resistor region by patterning the second conductive layer. A gate pattern of each cell transistor and a gate pattern of the MOS transistor are formed in the cell array region and in the MOS transistor region, respectively, by sequentially patterning the second conductive layer pattern, the dielectric layer, and the first conductive layer pattern. The gate pattern of the each cell transistor includes a sequentially stacked floating gate, dielectric layer, and control gate. The gate pattern of the MOS transistor includes a sequentially stacked gate electrode, dielectric layer, and dummy gate electrode.

Forming a first conductive layer includes forming an isolation layer defining an active region of the substrate, forming a gate oxide layer on the active region of the peripheral circuit region, and forming a tunnel oxide layer on the active region of the cell array region. Forming the first conductive layer further includes forming the first conductive layer on the substrate after forming the gate oxide layer and the tunnel oxide layer. A first photoresist pattern is formed on the first conductive layer, the first photoresist pattern exposing a predetermined portion of the cell array region, covering the MOS transistor region, and covering a predetermined portion of the resistor region. Forming the first conductive layer pattern includes patterning the first conductive layer using the first photoresist pattern as a mask.

The first conductive layer may be formed of polysilicon and the dielectric layer may be formed of an oxide-nitride-oxide (O/N/O) layer. The second conductive layer may be polysilicon or a metal polycide layer. Preferably, the metal polycide layer is a tungsten polycide layer or a molybdenum polycide layer.

The method may further comprise forming a second photoresist pattern on the second conductive layer, the second photoresist pattern exposing the resistor region and the predetermined portion of the MOS transistor region and forming the second conductive layer pattern by patterning the second conductive layer using the second photoresist pattern as a mask.

The method may further comprise forming an interdielectric layer on the substrate after forming the gate pattern of each cell transistor and the gate pattern of the MOS transistor and forming a contact hole exposing the gate electrode of the MOS transistor and a predetermined portion of the first conductive layer of the resistor region by sequentially patterning the interdielectric layer and the dielectric layer. Finally, an interconnection covering the contact hole is formed.

According to a second embodiment of the present invention, a method for manufacturing a nonvolatile memory device having a cell array region and a peripheral circuit region. The cell array region includes an array of cell transistors and the peripheral circuit region includes a MOS transistor for driving the array of cell transistors and a resistor. The method comprises forming a first conductive layer on a substrate and forming a first conductive layer pattern in the same manner as described above. An isolated resistor pattern is formed of the first conductive layer pattern on a resistor region of the substrate. A dielectric layer and a second conductive layer are sequentially formed on substrate where the first conductive layer pattern is formed. The dielectric layer and the second conductive layer are formed of the same material layers as those described for the first embodiment. The second conductive layer is patterned to form a second conductive layer pattern exposing the dielectric layer of the resistor region. At this time, the second conductive layer pattern exposes only the dielectric layer of the resistor region without exposing a predetermined region of the dielectric layer of the MOS transistor region. The first conductive layer pattern of the resistor region may be exposed by sequentially etching the exposed dielectric layer of the resistor region after forming the second conductive layer pattern.

The second conductive layer pattern, the dielectric layer, and the first conductive layer pattern that remain in the cell array region and the MOS transistor region are sequentially patterned to thereby form a gate pattern of the cell transistor and a gate pattern of the MOS transistor. The gate pattern of the cell transistor has a sequentially stacked floating gate, dielectric layer, and control gate electrode. The gate pattern of the MOS transistor has a sequentially stacked gate electrode, dielectric layer, and dummy gate electrode.

An interdielectric layer is formed on the substrate where the gate pattern is formed. The interdielectric layer is patterned until the dummy gate electrode is exposed. Thereafter, the dummy gate electrode and the dielectric layer are sequentially etched to form a first contact hole exposing the gate electrode of the MOS transistor. Also, the interdielectric layer and the dielectric layer are sequentially patterned to form a second contact hole exposing a source and drain region of the cell transistor and a predetermined region of the resistor pattern. At this time, the second contact hole exposing the control gate electrode of the cell transistor may be formed. When the dielectric layer is sequentially etched, after forming of the second conductive layer pattern to expose the first conductive layer pattern of the resistor region, etching the dielectric layer for forming the second contact hole can be omitted. The first and second contact holes are filled with a metal layer thereby forming an interconnection.

According to the present invention, the gate pattern of the MOS transistor formed in the peripheral circuit region and the gate pattern of the cell transistor formed in the cell array region can be formed using the same process. The gate electrode forming the gate pattern of the MOS transistor can directly contact an interconnection. Also, the resistor of the peripheral circuit region can be formed using only the first conductive layer making it easier to control the resistance value.

BRIEF DESCRIPTION OF THE DRAWINGS

The foregoing and other objects, features, and advantages of the present invention will become more readily apparent from the following detailed description of a preferred embodiment that proceeds with reference to the attached drawings.

FIGS. 1 through 6 are sectional views of a method for manufacturing a nonvolatile memory device according to a first embodiment of the present invention; and FIGS. 7 through 13 are sectional views of a method for manufacturing a nonvolatile memory device according to a second embodiment of the present invention.

DETAILED DESCRIPTION

Figure 5:
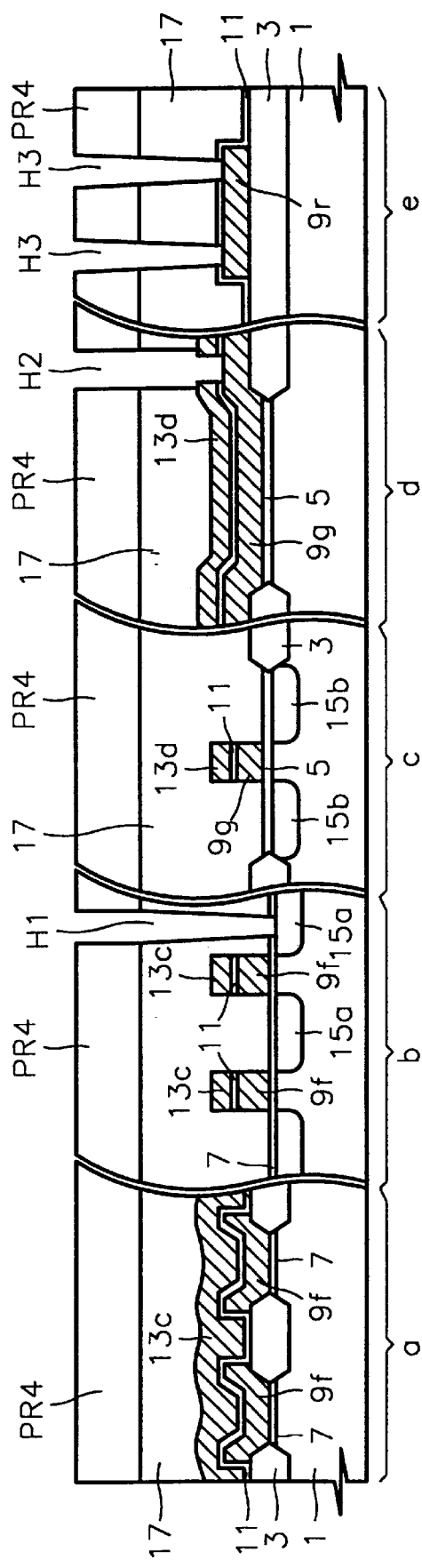

Referring to FIGS. 1 through 6, sections a and b indicate a cell array region, and sections c, d, and e indicate peripheral circuit regions. Region a is a sectional view of a cell transistor in the direction of the channel width and region b is a sectional view of the cell transistor in the direction of the channel length. Region c is a sectional view of a MOS transistor formed on the peripheral circuit region in the direction of the channel length, region d is a sectional view of a MOS transistor formed on the peripheral circuit region in the direction of the channel width, and region e is a sectional view of a resistor formed on the peripheral circuit region.

Referring to FIG. 1, an isolation layer 3 defining an active region is formed on a predetermined region of a semiconductor substrate 1. The isolation layer 3 is formed using, e.g., local oxidation of silicon (LOCOS) or a trench process. The semiconductor substrate 1 having the isolation layer 3 is thermally oxidized to thereby form a gate oxide layer 5 on the surface of the active region.

A mask pattern (not shown) such as a photoresist pattern is formed on the peripheral circuit region defined by sections c, d, and e. The gate oxide layer 5 formed on the cell array region defined by sections a and b is removed using an oxide etchant. The mask pattern covering the peripheral circuit regions c, d, and e is then removed. The semiconductor substrate where the mask pattern is removed is thermally oxidized to thereby form a thin tunnel oxide layer 7 of 100 Å or less on the surface of the active region of the cell array regions a and b. The gate oxide layer 5 formed on the active region of the peripheral circuit regions c, d, and e becomes thicker than the initial thickness. Thus, it is preferable to determine the initial thickness of the gate oxide layer 5 with reference to the thickness added after the tunnel oxide layer 7 is formed.

The first conductive layer 9 is then formed on the surface of the semiconductor substrate 1. Preferably, the first conductive layer is formed of a polysilicon layer. The first conductive layer 9 is then doped with an impurity, e.g., phosphorus (P) to thereby reduce its conductivity. The first conductive layer 9 of the region e where the resistor is formed may be doped with an impurity concentration different from that of the first conductive layer 9 covering the cell array regions a and b and the MOS transistor regions c and d.

A first photoresist pattern PR1 is formed on the first conductive layer 9. The first photoresist pattern PR1 exposes a predetermined region of the cell array regions a and b and covers the entire MOS transistor regions c and d. Also, the first photoresist pattern PR1 covers a predetermined region of the resistor region e. The predetermined portion of the cell array regions a and b opened by the first photoresist pattern PR1 corresponds to an upper region of the isolation layer 3 between the adjacent cell transistors along the direction of the channel width of the cell transistor as shown in FIG. 1.

Referring to FIG. 2, the first conductive layer 9 is etched using the first photoresist pattern PR1 as an etching mask thereby forming the first conductive layer pattern 9 including an isolated resistor pattern 9r on the resistor region e. At this time, predetermined regions of the isolation layer 3 of the cell array region a and b are simultaneously exposed. The first photoresist pattern PR1 is then removed. The process of doping the first conductive layer 9 may be omitted from FIG. 1. Here, as described in FIG. 1, the resistor pattern 9r may be doped to a concentration different from that of the first conductive layer pattern 9 formed on the cell array regions a and b and the MOS transistor regions c and d.

A dielectric layer 11 and a second conductive layer 13 are sequentially formed on the semiconductor substrate 1 where the first photoresist pattern PR1 has been removed. Preferably, the dielectric layer 11 is formed of a material layer having a high dielectric constant in order to increase a capacitance between the first conductive layer 9 and the second conductive layer 13. When the capacitance between the first conductive layer 9 and the second conductive layer 13 is increased, the coupling ratio of the cell transistor is increased thereby improving the program and erase operations of the cell transistor. An oxide-nitride-oxide (O/N/O) layer is widely used for the dielectric layer 11. Preferably, the second conductive layer 13 is formed of a material having low conductivity, e.g., a metal polycide layer comprising a silicide layer containing a refractory metal layer and a doped polysilicon layer. For instance, the second conductive layer is formed of a tungsten polycide layer or a molybdenum polycide layer. A second photoresist pattern PR2 is formed on the second conductive layer 13. As shown in FIG. 2, the second photoresist pattern PR2 exposes the resistor region e and a predetermined portion of the MOS transistor regions c and d.

Referring to FIG. 3, the second conductive layer 13 is etched using the second photoresist pattern PR2 as an etching mask thereby forming the second conductive layer pattern 13. When the second conductive layer 13 has been etched, the dielectric layer 11 of the resistor region e is exposed and a predetermined region of the dielectric layer 11 of the MOS transistor region c and d is exposed. The exposed dielectric layer 11 may be additionally etched thereby exposing a predetermined portion of the first conductive layer pattern 9 and the entire resistor pattern 9r. The second photoresist pattern PR2 is then removed.

A third photoresist pattern PR3 is formed on the semiconductor substrate 1. As shown in FIG. 3, the third photoresist pattern PR3 is a mask for defining a gate pattern of both the cell transistor and the MOS transistor. Thus, the third photoresist pattern PR3 covers the resistor region e and predetermined regions of the cell array regions a and b and the peripheral circuit regions c and d. Also, as shown in FIG. 3, the third photoresist pattern PR3 must be formed such that it covers the hole obtained by etching the second conductive layer of the MOS transistor regions c and d.

Referring to FIG. 4, the second conductive layer pattern 13, the dielectric layer 11, and the first conductive layer pattern 9 are sequentially etched using the third photoresist pattern PR3 as an etching mask. The sequential etching forms a gate pattern of both the cell transistor and the MOS transistor. The gate pattern of the cell transistor has a structure in which a floating gate 9f formed of the first conductive layer, a dielectric layer 11, and a control gate electrode 13c formed of the second conductive layer are sequentially stacked. The control gate electrode 13c acts as a word line. Also, the gate pattern of the MOS transistor has a structure in which a gate electrode 9g formed of the first conductive layer, a dielectric layer 11, and a dummy gate electrode 13d are sequentially stacked. As described in FIG. 3, the dummy gate electrode 13d forming the gate pattern of the MOS transistor includes the hole exposing a predetermined region of the dielectric layer. The third photoresist pattern PR3 is removed. Subsequently, a source and drain region 15a is formed on either side of the gate pattern of the cell transistor. A source and drain region 15b is also formed on either side of the gate pattern of the MOS transistor. The source and drain regions 15a and 15b are formed using conventional methods.

Referring to FIG. 5, an interdielectric layer 17 is formed on the semiconductor substrate 1 thus covering the source and drain regions 15a and 15b. Preferably, the interdielectric layer 17 is formed by sequentially stacking an undoped oxide layer and a doped oxide layer. Preferably, the undoped oxide layer is formed of a high temperature oxide (HTO) having dense film quality and the doped oxide layer is formed of a borophosphosilicate glass BPSG layer having good planarization characteristics.

A fourth photoresist pattern PR4 is formed on the interdielectric layer 17. The fourth photoresist pattern PR4 is a mask for defining a contact hole. As shown in FIG. 5, the fourth photoresist pattern PR4 is used to open the interdielectric layer 17 covering the hole passing through the dummy gate electrode 13d. The fourth photoresist pattern PR4 is also used to open a predetermined region of the interdielectric layer 17 covering the resistor pattern 9r. The interdielectric layer 17 covering the source and drain region 15a of the cell transistor is also opened. Although it is not shown in FIG. 5, the fourth photoresist pattern PR4 may open the interdielectric layer 17 covering the control gate electrode 13c of the cell transistor and the interdielectric layer 17 covering the source and drain regions 15b of the MOS transistor.

The exposed interdielectric layer 17 and the dielectric layer 11 are sequentially etched using the fourth photoresist pattern PR4 as an etching mask thereby forming contact holes H1, H2, and H3. When the dielectric layer 11 has been additionally etched after forming the second conductive layer pattern 13, only the interdielectric layer 17 is etched to thereby form contact holes H1, H2, and H3. The contact hole H1 exposes the source and drain region 15a of the cell transistor. The contact hole H2 exposes the gate electrode 9g of the MOS transistor and the contact hole H3 exposes the predetermined regions of the resistor pattern 9r.

Figure 6:
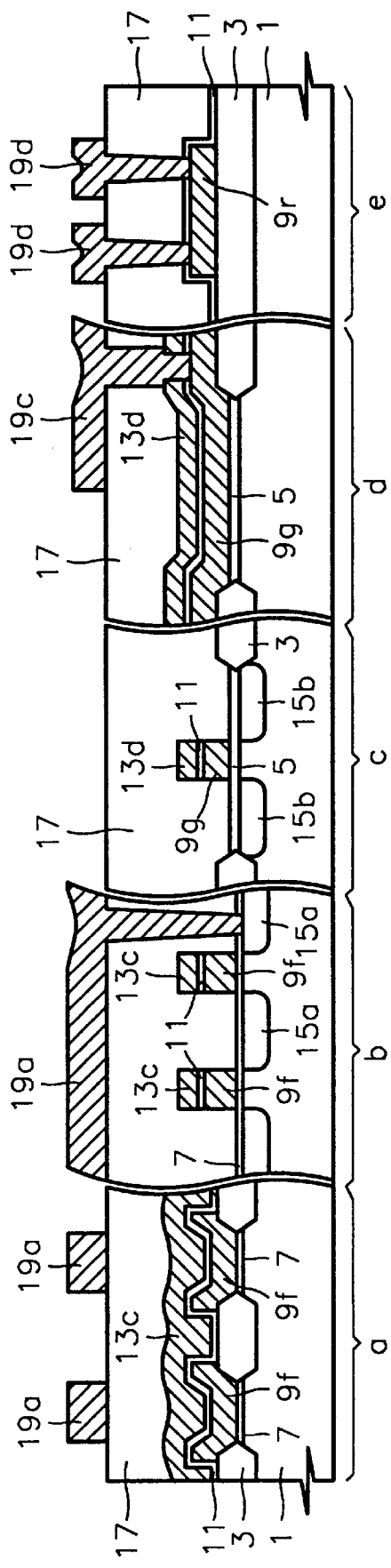

Referring to FIG. 6, the fourth photoresist pattern PR4 is removed. A metal layer filling the contact holes H1, H2, and H3 is formed on the semiconductor substrate 1 where the fourth photoresist pattern PR4 is removed. The metal layer is patterned. The patterned metal layer forms an interconnection 19a contacting the source and drain region 15a of the cell transistor, an interconnection 19c directly contacting the gate electrode 9g of the MOS transistor, and interconnections 19d directly contacting the resistor pattern 9r. The interconnection 19a corresponds to a bit line of the cell array region.

Referring to FIGS. 7 through 13, reference characters a and b indicate cell array regions and reference characters c, d and e indicate peripheral circuit regions. Region a is a sectional view of a cell transistor in the direction of the cell width and region b is a sectional view of a cell transistor in the direction of the channel length. Also, a portion indicated by region c is a sectional view of a MOS transistor formed on the peripheral circuit region in the direction of the channel length, a region d is a sectional view of a MOS transistor formed on the peripheral circuit region in the direction of the channel width, and region e is a sectional view of a resistor formed on the peripheral circuit region.

Referring to FIG. 7, an isolation layer 53 is formed on a predetermined region of a semiconductor substrate 51. A gate oxide layer 55 and a tunnel oxide layer 57 are formed on an active region defined by the isolation layer 53. Thereafter, a first conductive layer 59 is formed on semiconductor substrate 51 thus covering the gate oxide layer 55 and the tunnel oxide layer 57. A first photoresist pattern PR1' is formed on the first conductive layer 59. The isolation layer 53, the gate oxide layer 55, the tunnel oxide layer 57, the first conductive layer 59 and the first photoresist pattern PR1' are formed in the same manner as described for the first embodiment of the present invention ( FIG. 1). Also, the first photoresist pattern PR1', shown in FIG. 7, has the same structure as that of the first photoresist pattern PR1 shown in FIG. 1.

Referring to FIG. 8, the first conductive layer 59 is etched using the first photoresist pattern PR1' as an etching mask. The etched first conductive layer 59 forms a first conductive layer pattern 59 including a resistor pattern 59r covering a predetermined region of the resistor region e. The first photoresist pattern PR1' is then removed. A dielectric layer 61 and a second conductive layer 63 are sequentially formed on the surface of the semiconductor substrate 51 where the first photoresist pattern PR1' is removed. The dielectric layer 61 and the second conductive layer 63 are formed in the same manner as that described for the first embodiment of the present invention. A second photoresist pattern PR2' is formed on the second conductive layer 63. The second photoresist pattern PR2' covers the cell array region a and b and the MOS transistor regions c and d. The second photoresist pattern PR2' exposes the resistor region e.

Figure 9:
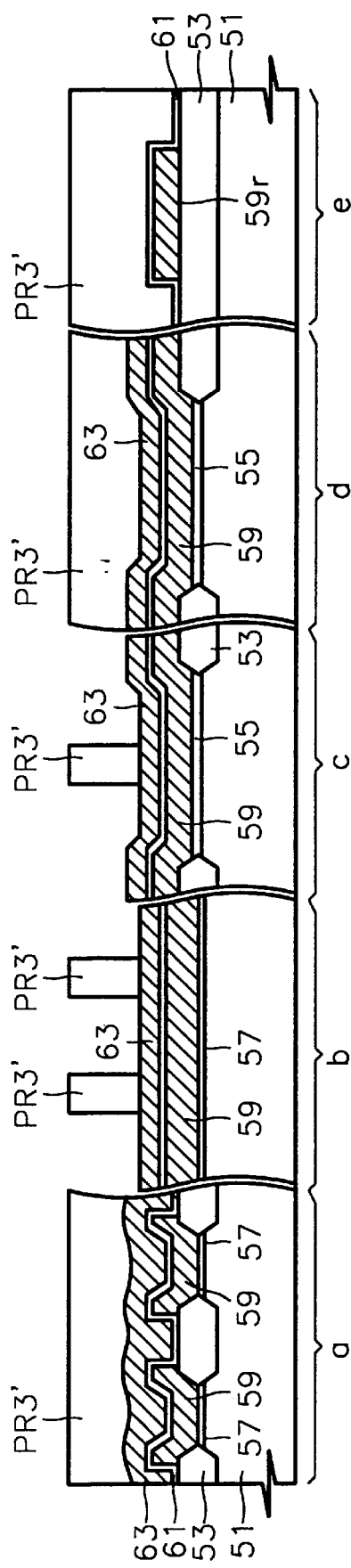

Referring to FIG. 9, the second conductive layer 63 is etched using the second photoresist pattern PR2' as an etching mask thereby forming a second conductive layer pattern 63 covering the overall cell array region a and b and the overall MOS transistor region c and d. The etched second conductive layer 63 also exposes the dielectric layer 61 of the resistor region e. The overall resistor pattern 59r may be exposed by additionally etching the exposed dielectric layer 61. The second photoresist pattern PR2' is removed. A third photoresist pattern PR3' is formed on the semiconductor substrate 51 where the second photoresist pattern PR2' is removed. The third photoresist pattern PR3' is a mask for forming a gate pattern of a cell transistor and a gate pattern of a MOS transistor. Thus, the third photoresist pattern PR3' covers the entire resistor region e as in the first embodiment and covers a predetermined region of cell array regions a and b and a predetermined region of the MOS transistor regions c and d.

Figure 10:
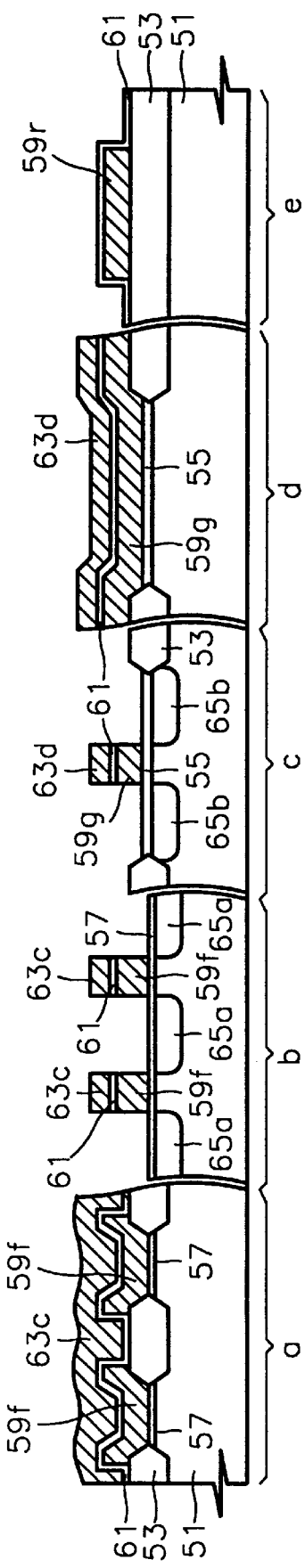

Referring to FIG. 10, the second conductive layer 63, a dielectric layer 61, and the first conductive layer 59 are sequentially etched using the third photoresist pattern PR3' as an etching mask thereby forming a gate pattern of the cell transistor on the cell array region a and b. The sequential etching process also forms a gate pattern of the MOS transistor regions c and d. The gate pattern of the cell transistor has a structure in which a floating gate 59f formed of the first conductive layer, a dielectric layer 61, and a control gate electrode 63c are sequentially stacked. The gate pattern of the MOS transistor has a structure in which a gate electrode 59g formed of the first conductive layer, a dielectric layer 61, and a dummy gate electrode 63d are sequentially stacked. Unlike the first embodiment of the present invention the dummy gate electrode 63d has no hole for exposing a predetermined region of the dielectric layer 61 on the gate electrode 59g. The third photoresist pattern PR3' is then removed. After removing the third photoresist pattern PR3', source and drain region 65a is formed on both sides of the gate pattern of the cell transistor in the same manner as in the first embodiment of the present invention. A source and drain region 65b is also formed on both sides of the gate pattern of the MOS transistor after removing the third photoresist pattern PR3'.

Referring to FIG. 11, an interdielectric layer 67 is formed on the semiconductor substrate 51 where the source and drain regions 65a and 65b have been formed. The interdielectric layer 67 is formed in the same manner as that of the first embodiment of the present invention. A fourth photoresist pattern PR4' is formed on the interdielectric layer 67. Unlike the first embodiment of the present invention the fourth photoresist pattern PR4' exposes only the interdielectric layer 67 on the gate electrode 59g of the MOS transistor. The interdielectric layer 67 is etched using the fourth photoresist pattern PR4' as an etching mask, so that a predetermined region of the dummy gate electrode 63d of the MOS transistor is exposed. Then, the predetermined region of the exposed dummy gate electrode 63d and the dielectric layer 61 are sequentially etched thereby forming a first contact hole H1' exposing a predetermined region of the gate electrode 59g.

Referring to FIG. 12, the fourth photoresist pattern PR4' is removed. A fifth photoresist pattern PR5' is formed on the semiconductor substrate where the first contact hole H1' has been formed. The fifth photoresist pattern PR5' is used to expose the interdielectric layer 67 on the resistor pattern 59r and on the source and drain region 65a of the cell transistor as shown in FIG. 12. The fifth photoresist pattern PR5' may have a hole (not shown) exposing the interdielectric layer 67 on the control gate electrode 63c of the cell transistor and on the source and drain region 65b of the MOS transistor. The exposed interdielectric layer 67 and the dielectric layer 61 are sequentially etched using the fifth photoresist pattern PR5' as an etching mask. The etched interdielectric layer 67 and the dielectric layer 61 form second contact holes H2'. When the dielectric layer 61 has already been etched during the step of forming the second conductive layer pattern 63 exposing the resistor region e, the step of etching the dielectric layer 61 after etching the interdielectric layer 67 may be omitted. The second contact holes H2' expose a predetermined region of the resistor pattern 59r formed of the first conductive layer and a source and drain region 65a of the cell transistor.

Figure 13:
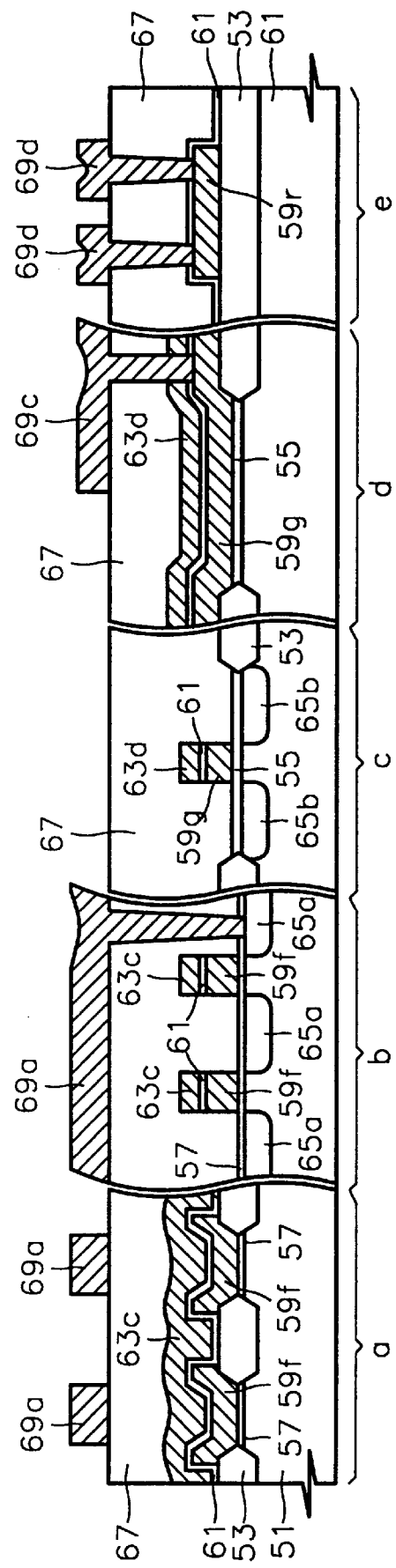

Referring to FIG. 13, the fifth photoresist pattern PR5' is removed. A conductive layer filling the first and the second contact holes H1' and H2', e.g., a metal layer, is formed on the semiconductor substrate 51. The metal layer is patterned in the usual manner thereby forming interconnections 69a, 69c, and 69d. The interconnection 69a corresponds to a bit line contacting the source and drain region 65a of the cell transistor. The interconnection 69c directly contacts the gate electrode 59g of the MOS transistor and the interconnection 69d directly contacts the resistor pattern 59r.

According to the above-described embodiments of the present invention, the gate pattern of the cell transistor and the gate pattern of the MOS transistor are formed in the same process step. The gate electrode of the MOS transistor directly contacts an interconnection. Thus, contact resistance between the gate electrode of the MOS transistor and the interconnection is reduced reducing the delay time of an electric signal applied to the gate electrode of the MOS transistor. Also, a resistor can be formed of only a first conductive layer allowing easy control of the resistance on the peripheral circuit region.

The second embodiment of the present invention requires one additional mask process compared to the first embodiment. However, according to the second embodiment of the present invention, the area of the first contact hole exposing the gate electrode of the MOS transistor is minimized.

Having illustrated and described the principles of my invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A method for manufacturing a nonvolatile memory device having a cell array and a peripheral circuit region, the cell array region including a cell array having a plurality of cell transistors and the peripheral circuit region including a resistor region having at least one resistor and a MOS transistor region having a MOS transistors for driving the cell transistors, the method comprising:

forming a first conductive layer on a semiconductor substrate;

forming a first conductive layer pattern and an isolated resistor pattern in the resistor region by patterning the first conductive layer;

sequentially forming a dielectric layer and a second conductive layer on the substrate;

forming a second conductive layer pattern exposing a portion of the dielectric layer in the MOS transistor region and the entire are of the dielectric layer in the resistor region by patterning the second conductive layer; and forming a gate pattern of each cell transistor and a gate pattern of the MOS transistor in the cell array region and in the MOS transistor region, respectively, by sequentially patterning the second conductive layer pattern, the dielectric layer, and the first conductive layer pattern;

wherein the gate pattern of the each cell transistor includes a sequentially stacked floating gate, dielectric layer, and control gate; and wherein the gate pattern of the MOS transistor includes a sequentially stacked gate electrode, dielectric layer, and dummy gate electrode, the dummy gate electrode including the exposed region of the dielectric layer of the MOS transistor region.

2. The method of claim 1 wherein forming the first conductive layer includes:

forming an isolation layer defining an active region of the substrate;

forming a gate oxide layer on the active region of the peripheral circuit region;

forming a tunnel oxide layer on the active region of the cell array region; and forming the first conductive layer on the substrate after forming the gate oxide layer and the tunnel oxide layer.

3. The method of claim 1 wherein forming the first conductive layer pattern and the isolated resistor pattern includes:

forming a first photoresist pattern on the first conductive layer, the first photoresist pattern exposing a predetermined portion of the cell array region, covering the MOS transistor region, and covering a predetermined portion of the resistor region; and forming the first conductive layer pattern by patterning the first conductive layer using the first photoresist pattern as a mask.

4. The method of claim 1 wherein forming the first conductive layer includes forming the first conductive layer of polysilicon.

5. The method of claim 1 wherein forming the dielectric layer includes forming the dielectric layer of an oxide-nitride-oxide (O/N/O) layer.

6. The method of claim 1 wherein forming the second conductive layer includes forming the second conductive layer of polysilicon or a metal polycide.

7. The method of claim 1 wherein forming the second conductive layer patter comprises:

forming a second photoresist pattern on the second conductive layer, the second photoresist pattern exposing the resistor region and a predetermined portion of the MOS transistor region; and forming the second conductive layer pattern by patterning the second conductive layer using the second photoresist pattern as a mask.

8. The method of claim 1 further comprising:

forming an interdielectric layer on the substrate after forming the gate pattern of each cell transistor and the gate pattern of the MOS transistor;

forming a contact hole exposing the gate electrode of the MOS transistor and a predetermined portion of the first conductive layer of the resistor region by sequentially patterning the interdielectric layer and the dielectric layer; and forming an interconnection covering the contact hole.

9. A method for manufacturing a nonvolatile memory device having a cell array region and a peripheral circuit region, the cell array region including an array of cell transistors and the peripheral circuit region including a MOS transistor region having MOS transistors for driving the cell transistors and a resistor region having at least one resistor, the method comprising:

forming a first conductive layer on a semiconductor substrate;

forming a first conductive layer pattern and an isolated resistor pattern in the resistor region by patterning the first conductive layer;

sequentially forming a dielectric layer and a second conductive layer on the substrate;

forming a second conductive layer pattern exposing the dielectric layer of the resistor region by patterning the second conductive layer;

forming a gate pattern of the cell transistors in the cell array region and a gate pattern of the MOS transistor in the MOS transistor region by sequentially patterning the second conductive layer pattern, the dielectric layer, and the first conductive layer pattern, the gate pattern of the cell transistors including a sequentially stacked floating gate, dielectric layer, and control gate electrode and the gate pattern of the MOS transistor including a sequentially stacked gate electrode, dielectric layer, and dummy gate electrode;

forming an interdielectric layer on the substrate after forming the gate patterns;

forming a first contact hole by sequentially patterning the interdielectric layer, the dummy gate electrode, and the dielectric layer, the first contact hole exposing a predetermined portion of the gate electrode; and forming a second contact hole by sequentially patterning the interdielectric layer and the dielectric layer, the second contact hole exposing a source and drain region of the cell transistors and a predetermined portion of the resistor region.

10. The method of claim 9 wherein forming the first conductive layer includes:

forming an isolation layer defining an active region on the predetermined region of the substrate;

forming a gate oxide layer on the active region of the peripheral circuit region;

forming a tunnel oxide layer on the active region of the cell array; and forming a first conductive layer on the substrate where the tunnel oxide layer and the gate oxide layer are formed.

11. The method of claim 9 wherein forming the first conductive conductive layer pattern and the isolated resistor pattern includes:

forming the first photoresist pattern on the first conductive layer, the first photoresist pattern exposing a predetermined portion of the cell array region, covering the MOS transistor region, and covering a predetermined portion of the resistor region; and forming a first conductive layer pattern by patterning the first conductive layer using the first photoresist pattern as a mask, the first conductive layer pattern exposing the isolation between adjacent cell transistors in a channel width direction, covering the MOS transistor region, and a predetermined portion of the resistor region.

12. The method of claim 9 wherein forming the first conductive layer includes forming the first conductive layer of polysilicon.

13. The method of claim 9 wherein forming the dielectric layer includes forming the dielectric layer of an oxide-nitride-oxide (O/N/O).

14. The method of claim 9 wherein the second conductive layer includes a polysilicon layer or a metal polycide layer.

15. The method of claim 9 further comprising exposing the first conductive layer pattern on the resistor region by etching the exposed dielectric layer after forming the second conductive layer pattern.

16. The method of claim 9 further comprising forming an interconnection filling the first and second contact holes.

17. A method for manufacturing a nonvolatile memory device comprising a cell array region, a MOS transistor region, and a resistor region, comprising:

forming a first conductive layer on a semiconductor substrate;

forming a first conductive layer pattern and an isolated resistor pattern in the resistor region by patterning the first conductive layer;

sequentially forming a dielectric layer and a second conductive layer on the substrate;

forming a second conductive layer pattern by patterning the second conductive layer; and forming a gate pattern of a cell transistor in the cell array region and a gate pattern of a MOS transistor in the MOS transistor region by sequentially patterning the second conductive layer, the dielectric layer, and the first conductive layer;

wherein forming the gate pattern of the cell transistor and the gate pattern of the MOS transistor includes:

forming a third photoresist pattern on the substrate, the third photoresist pattern covering the resistor region and predetermined portions of the cell and MOS transistor regions; and forming the gate pattern of the cell transistor and the gate pattern of the MOS transistor by sequentially patterning the second conductive layer pattern, the dielectric layer, and the first conductive layer pattern using the third photoresist pattern as a mask.

18. The method of claim 17 wherein forming the first conductive layer includes:

forming an isolation layer on the substrate;

forming a gate oxide layer on the MOS transistor region;

forming a tunnel oxide layer on the cell array region; and forming the first conductive layer on the substrate after forming the gate and the tunnel oxide layers.

19. The method of claim 17 wherein forming the first conductive layer pattern and the isolated resistor pattern includes:

forming a first photoresist pattern on the first conductive layer, the first photoresist pattern exposing a predetermined portion of the cell array region, covering the MOS transistor region, and covering a predetermined portion of the resistor region; and forming the first conductive layer pattern by patterning the first conductive layer using the first photoresist pattern as a mask.

20. The method of claim 17 wherein forming the second conductive layer pattern includes:

forming a second photoresist pattern on the second conductive layer, the second photoresist pattern exposing the resistor region and a predetermined portion of the MOS transistor region; and forming the second conductive layer pattern by patterning the second conductive layer using the second photoresist pattern as a mask.

21. The method of claim 17 further including:

forming an interdielectric layer on the substrate after forming the gate pattern of each cell transistor and the gate pattern of the MOS transistor;

forming a fourth photoresist pattern on the interdielectric film;

forming a contact hole exposing a gate electrode of the MOS transistor and a predetermined portion of the first conductive layer of the resistor region by sequentially patterning the interdielectric layer and the dielectric layer using the fourth photoresist pattern as a mask; and forming a metal interconnection filling the contact hole.

22. The method of claim 1 further comprising exposing the first conductive layer patter on a portion of the MOS transistor region and on the resistor region by etching the exposed dielectric layer after forming the second conductive layer pattern.

23. The method of claim 17 wherein forming the second conductive layer pattern further comprising:

forming a second photoresist pattern on the second conductive layer, wherein the second photoresist pattern exposes the resistor region; and forming the second conductive layer pattern by patterning the second conductive layer by using the second photoresist pattern as a mask.

* * * * *

UNITED STATES PATENT AND TRADEMARK OFFICE
CERTIFICATE OF CORRECTION

PATENT NO.    : 6,228,714 B1
DATED         : May 8, 2001
INVENTOR(S)   : Jung-dal Choi It is certified that error appears in the above-identified patent and that said Letters Patent is hereby corrected as shown below:

Column 2,
Line 27, "The gate pattern of the each cell" should read, -- The gate pattern of each cell--

Column 9,
Line 26, "region and the entire are" should read, -- region and the entire area --
Line 35, "wherein the gate pattern of the each" should read, -- wherein the gate patern of each --

Column 10,
Line 8, "conductive layer patter" should read, -- conductive layer pattern --

Column 11,
Line 13, "conductive conductive layer pattern" should read, -- conductive layer pattern --

Column 12,
Line 49, "first conductive layer patter" should read, -- first conductive layer pattern --

Signed and Sealed this

First Day of October, 2002

*Attest:*

*Attesting Officer*

JAMES E. ROGAN
*Director of the United States Patent and Trademark Office*